(12) United States Patent
Seo et al.

(10) Patent No.: US 12,082,454 B2
(45) Date of Patent: Sep. 3, 2024

(54) DISPLAY APPARATUS

(71) Applicant: SAMSUNG DISPLAY CO., LTD., Yongin-si (KR)

(72) Inventors: Ilhun Seo, Yongin-si (KR); Jisil Lee, Yongin-si (KR); Woosik Jun, Yongin-si (KR); Yunmo Chung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 432 days.

(21) Appl. No.: 17/554,403

(22) Filed: Dec. 17, 2021

(65) Prior Publication Data
US 2022/0199732 A1 Jun. 23, 2022

(30) Foreign Application Priority Data
Dec. 18, 2020 (KR) ........................ 10-2020-0178919

(51) Int. Cl.
*H10K 59/126* (2023.01)
*H10K 59/122* (2023.01)
(Continued)

(52) U.S. Cl.
CPC ......... *H10K 59/126* (2023.02); *H10K 59/122* (2023.02); *H10K 59/131* (2023.02); *H10K 59/38* (2023.02)

(58) Field of Classification Search
CPC .. H10K 59/126; H10K 59/122; H10K 59/131; H10K 59/38; H10K 59/12;
(Continued)

(56) References Cited

U.S. PATENT DOCUMENTS

| 9,190,426 B2 | 11/2015 | Kwon et al. |
| 2020/0274093 A1 | 8/2020 | Eom et al. |
| 2020/0295310 A1 | 9/2020 | Moon et al. |

FOREIGN PATENT DOCUMENTS

| CN | 108899316 B | * 10/2020 | ............. G09F 9/301 |
| KR | 1020150003581 A | 1/2015 | |

(Continued)

OTHER PUBLICATIONS

Machine translation of CN-108899316-B (Year: 2020).*

*Primary Examiner* — Anne M Hines
*Assistant Examiner* — Jose M Diaz
(74) *Attorney, Agent, or Firm* — CANTOR COLBURN LLP

(57) ABSTRACT

A display apparatus includes a first substrate including a display area and a peripheral area outside the display area, a display layer disposed in the display area and including first to third light-emitting elements, a shield pattern portion including a lower pattern layer disposed in the peripheral area and surrounding at least part of the display layer, and an upper pattern layer disposed above the lower pattern layer and electrically connected to the lower pattern layer through contact holes in an insulating layer covering the lower pattern layer, a second substrate disposed above the display layer, and a sealing portion surrounding at least a part of the display layer, disposed between the first substrate and the second substrate, covering one side of the shield pattern portion in a direction toward the display layer, and overlapping the contact holes.

20 Claims, 9 Drawing Sheets

(51) Int. Cl.
*H10K 59/131* (2023.01)
*H10K 59/38* (2023.01)

(58) Field of Classification Search
CPC .. H10K 59/1213; H10K 50/865; H10K 50/84; H10K 50/844; H10K 50/8426; H10K 2102/341; H10K 2102/331; G02B 5/201; H01L 27/0248
See application file for complete search history.

(56) References Cited

FOREIGN PATENT DOCUMENTS

| KR | 1020180126223 A | 11/2018 |
| KR | 1020200104475 A | 9/2020 |
| KR | 1020200110505 A | 9/2020 |

\* cited by examiner

DISPLAY APPARATUS

This application claims priority to Korean Patent Application No. 10-2020-0178919, filed on Dec. 18, 2020, and all the benefits accruing therefrom under 35 U.S.C. § 119, the content of which in its entirety is herein incorporated by reference.

BACKGROUND

1. Field

One or more embodiments relate to display apparatuses, and more particularly, to display apparatuses with improved reliability.

2. Description of the Related Art

Display apparatuses are for displaying data visually. The display apparatuses are used as display portions of compact products such as mobile phones and the like, or as display portions of large products such as televisions and the like.

A display apparatus may include a plurality of pixels that receive electrical signals and emit light to display an image to the outside. Each pixel may include a light-emitting element, and for example, an organic light-emitting display apparatus may include an organic light-emitting diode as the light-emitting element. Generally, the organic light-emitting display apparatus is operated as a thin film transistor and the organic light-emitting diode are formed on a substrate and the organic light-emitting diode emits light by itself.

Recently, as purposes of display apparatuses are diversified, designs of the display apparatuses to improve quality of display apparatuses have been made in various ways.

SUMMARY

However, in a display apparatus according to the related art, as defects are generated in a manufacturing process, reliability may be lowered.

One or more embodiments provide display apparatuses with improved reliability. However, this is exemplary, and the scope of the invention is not limited thereto.

Additional features will be set forth in part in the description which follows and, in part, will be apparent from the description, or may be learned by practice of the presented embodiments of the invention.

According to an embodiment, a display apparatus include a first substrate including a display area and a peripheral area outside the display area, a display layer disposed in the display area and including first to third light-emitting elements, a shield pattern portion including a first pattern layer disposed in the peripheral area and surrounding at least part of the display layer, and a second pattern layer disposed on the first pattern layer and electrically connected to the first pattern layer through contact holes in an insulating layer covering the first pattern layer, a second substrate disposed on the display layer such that a surface of the second substrate facing the first substrate is directed to the display layer, and a sealing portion surrounding at least a part of the display layer, disposed between the first substrate and the second substrate, covering one side of the shield pattern portion in a direction toward the display layer, and overlapping the contact holes.

In an embodiment, the contact holes may be arranged only in an area overlapping the sealing portion.

In an embodiment, a distance from an edge of a contact hole arranged at an outermost side among the contact holes on a surface of the insulating layer facing the second substrate to an outer edge of the sealing portion may be greater than or equal to a preset distance.

In an embodiment, the distance from the edge of the contact hole arranged at the outermost side among the contact holes on the surface of the insulating layer to the outer edge of the sealing portion may be greater than or equal to about 300 micrometers (μm).

In an embodiment, the first pattern layer may include first wirings that extend in a first direction and a first bridge electrode that extends in a second direction intersecting the first direction and electrically connects the first wirings.

In an embodiment, the second pattern layer may include second wirings that overlap the first wirings and a second bridge electrode that overlaps the first bridge electrode.

In an embodiment, the first wirings and the first bridge electrode may be unitary with each other, and the second wirings and the second bridge electrode may be unitary with each other.

In an embodiment, the display layer may further include thin film transistors that are electrically connected to each of the first to third light-emitting elements and include a semiconductor layer, a gate electrode overlapping the semiconductor layer, and a source electrode and a drain electrode that are both electrically connected to the semiconductor layer.

In an embodiment, the first pattern layer and the gate electrode may include the same material and have the same layer structure.

In an embodiment, the second pattern layer, and the source electrode and the drain electrode, may include the same material and the same layer structure.

In an embodiment, the display apparatus may further include a support layer that is disposed between the second substrate and the sealing portion such that a surface of the support layer is directed to the first substrate.

In an embodiment, the second substrate may include a first area corresponding to the first light-emitting element, a second area corresponding to the second light-emitting element, and a third area corresponding to the third light-emitting element, and further includes a first color filter layer disposed on the surface of the second substrate in the first area, a second color filter layer disposed on the surface of the second substrate in the second area, and a third color filter layer disposed on the surface of the second substrate in the third area.

In an embodiment, the support layer may include a first sub-layer disposed on the surface of the second substrate, a second sub-layer disposed on a surface of the first sub-layer facing the first substrate, and a third sub-layer disposed on a surface of the second sub-layer facing the first substrate.

In an embodiment, the first sub-layer may include the same material as a material included in the first color filter layer, the second sub-layer includes the same material as a material included in the second color filter layer, and the third sub-layer includes the same material as a material included in the third color filter layer.

In an embodiment, the support layer may further include at least one insulating layer that is disposed on a surface of the third sub-layer facing the first substrate.

In an embodiment, the support layer may further include a low-refractive layer that is disposed on a surface of the third sub-layer facing the first substrate.

In an embodiment, the support layer may further include at least one insulating layer that is disposed on a surface of the low-refractive layer facing the first substrate.

In an embodiment, the display apparatus may further include a bank disposed on a surface of an insulating layer facing the first substrate, the insulating layer covering surfaces of the first color filter layer to the third color filter layer facing the first substrate, and defining a first opening corresponding to the first area, a second opening corresponding to the second area, and a third opening corresponding to the third area, a light-transmitting layer filling the first opening, a second color quantum-dot layer filling the second opening, and a third color quantum-dot layer filling the third opening.

In an embodiment, a distance from an outer edge of the bank to an inner edge of the sealing portion may be greater than or equal to a preset distance.

In an embodiment, the distance from the outer edge of the bank to the inner edge of the sealing portion may be greater than or equal to about 300 μm.

BRIEF DESCRIPTION OF THE DRAWINGS

The above and other features, and advantages of certain embodiments of the invention will be more apparent from the following description taken in conjunction with the accompanying drawings, in which.

DETAILED DESCRIPTION

Figure 1:
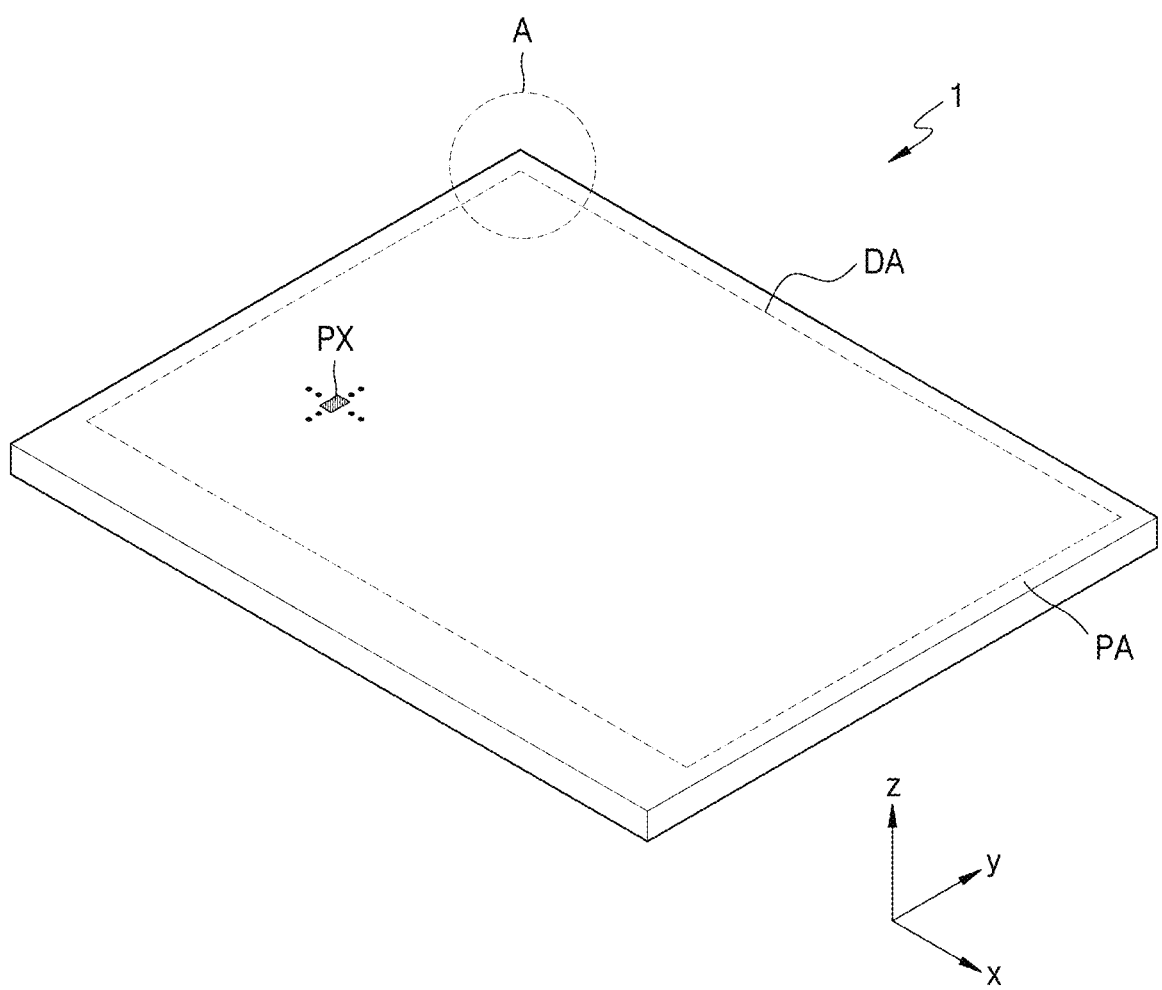
FIG. 1 is a schematic perspective view of an embodiment of a portion of a display apparatus.

Reference will now be made in detail to embodiments, examples of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Various modifications may be applied to the embodiments, and particular embodiments will be illustrated in the drawings and described in the detailed description section. The effect and features of the embodiments, and a method to achieve the same, will be clearer referring to the detailed descriptions below with the drawings. However, the embodiments may be implemented in various forms, not by being limited to the embodiments presented below.

Hereinafter, embodiments will be described in detail with reference to the accompanying drawings, and in the description with reference to the drawings, the same or corresponding constituents are indicated by the same reference numerals and redundant descriptions thereof are omitted.

In an embodiment below, while such terms as "first," "second," etc., may be used to describe various components, such components must not be limited to the above terms. The above terms are used only to distinguish one component from another.

In an embodiment below, an expression used in the singular encompasses the expression of the plural, unless it has a clearly different meaning in the context.

In an embodiment below, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

In an embodiment below, it will be understood that when a component, such as a layer, a film, a region, or a plate, is referred to as being "on" another component, the component can be directly on the other component or intervening components may be thereon.

Sizes of components in the drawings may be exaggerated for convenience of explanation. For example, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the specification, the expression such as "A and/or B" may include A, B, or A and B. Furthermore, the expression such as "at least one of A and B" may include A, B, or A and B.

In the embodiments below, it will be understood that when a layer, region, or component is referred to as being "connected to" another layer, region, or component, it can be directly connected to the other layer, region, or component or indirectly connected to the other layer, region, or component via intervening layers, regions, or components. For example, in the specification, when a layer, region, or component is referred to as being electrically connected to another layer, region, or component, it can be directly electrically connected to the other layer, region, or component or indirectly electrically connected to the other layer, region, or component via intervening layers, regions, or components.

In an embodiment below, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Figure 2:
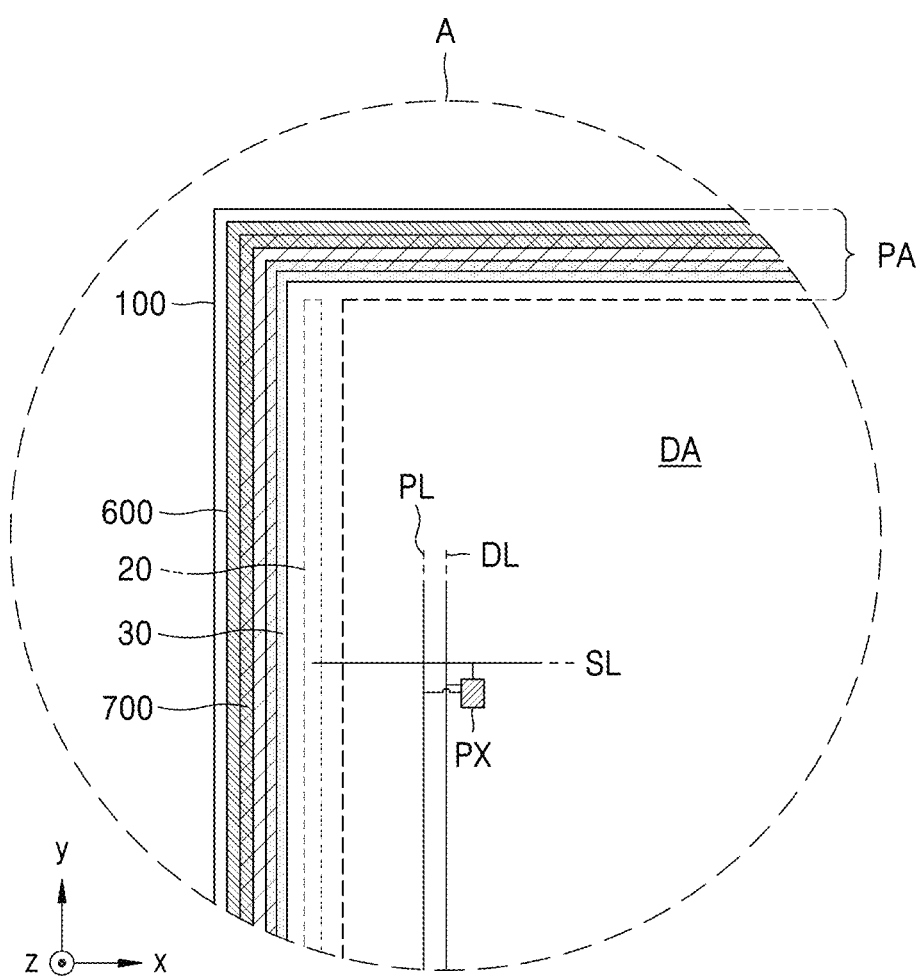
FIG. 2 is a schematic enlarged plan view of a portion of a region A of FIG. 1.

FIG. 1 is a schematic perspective view of an embodiment of a portion of a display apparatus 1. FIG. 2 is a schematic enlarged plan view of a portion of a region A of FIG.

As illustrated in FIG. 1, the display apparatus 1 in an embodiment may include a display area DA where light is emitted and a peripheral area PA where no light is emitted. The display apparatus 1 may include a first substrate 100, and the first substrate 100 may include an area corresponding to the display area DA and an area corresponding to the peripheral area PA.

Although FIG. 1 illustrates the display apparatus 1 in which the display area DA is quadrangular (e.g., rectangular), the shape of the display area DA may be circular, oval, polygonal, and the like.

A plurality of pixels PX may be disposed in the display area DA, and each of the pixels PX is disposed at a position where a scan line SL extending in an x-axis direction and a data line DL extending in a y-axis direction intersect with each other. Each of the pixels PX may be provided with a pixel circuit connected to the scan line SL, the data line DL, and a driving voltage supply line PL and a light-emitting element connected to the pixel circuit.

The peripheral area PA may surround at least a part of the display area DA. In an embodiment, the peripheral area PA may entirely surround the display area DA, for example. The peripheral area PA may include a pad area (not shown) at one side thereof. A pad portion including a plurality of pads may be arranged in the pad area. As each of the pads included in the pad portion is electrically connected to pads of a printed circuit board ("PCB"), each pad may receive a signal input through the PCB. To this end, the pad portion may include a plurality of pads. The pads may be electrically connected to the PCB and the like, by being exposed by not being covered with an insulating layer.

Various wirings for transmitting electrical signals to be applied to the display area DA may be disposed in the peripheral area PA. Furthermore, a part of a circuit portion for controlling electrical signals to be applied to the display area DA may be disposed in the peripheral area PA. In an embodiment, a driving portion 20, a power supply wiring 30, a shield pattern portion 600, and a sealing portion 700 may be disposed in the peripheral area PA.

The driving portion 20 may include an emission driving circuit, a scan driving circuit, and the like. The emission driving circuit may be disposed in the peripheral area PA of the first substrate 100, and may generate an emission control signal and transmit the generated signal to each of the pixels PX through an emission control line (not shown). The scan driving circuit may be disposed in the peripheral area PA of the first substrate 100, and may generate a scan signal and transmit the generated signal to each of the pixels PX through the scan line SL.

The power supply wiring 30 may be disposed in the peripheral area PA of the first substrate 100 by surrounding at least part of the display area DA. The power supply wiring 30 may provide driving power to the pixels PX through the driving voltage supply line PL, or common power to a common electrode of the light-emitting element.

The shield pattern portion 600 may be disposed in the peripheral area PA of the first substrate 100. The shield pattern portion 600 may surround at least part of the display area DA. In an embodiment, the shield pattern portion 600 may entirely surround the display area DA. Furthermore, the shield pattern portion 600 may surround the display area DA overall, except a pad area (not shown), for example.

The shield pattern portion 600 may prevent infiltration of static electricity generated during manufacture or use of the display apparatus 1, toward the display area DA. In an embodiment, the shield pattern portion 600 may absorb and discharge the static electricity generated during manufacture or use of the display apparatus 1, for example. Accordingly, the shield pattern portion 600 may prevent infiltration of static electricity into the display area DA, thereby preventing defects from occurring, for example, damage to the light-emitting element, the pixel circuit, and the like due to the static electricity.

The sealing portion 700 may be provided between the first substrate 100 and a second substrate 400. The sealing portion 700 may bond the first substrate 100 to the second substrate 400. The sealing portion 700 may be provided between the first substrate 100 and the second substrate 400 in the peripheral area PA and may surround the display area DA overall. Accordingly, a space in the display area DA defined by the first substrate 100, the second substrate 400 and the sealing portion 700 is blocked from the outside, and thus, external moisture or impurities may be prevented from infiltrating into the display apparatus 1.

The sealing portion 700 may include an inorganic material such as frit, epoxy, and the like. In an embodiment, frit may be understood as a paste in which a laser or infrared absorbent material, an organic binder, a filler for reducing a thermal expansion coefficient, and the like is included in a main material such as $SiO_2$ and the like. Frit in a paste may be cured as the organic binder and moisture are removed through drying and firing processes. The laser or infrared absorbent material may include a transition metal compound. The frit may be cured by laser and the like, thereby forming the sealing portion 700.

The sealing portion 700 is disposed at least partially overlapping an adjacent element, and thus, dead space of the display apparatus 1 may be reduced. In a detailed example, the sealing portion 700 may be disposed to cover and overlap a part of the power supply wiring 30 or the shield pattern portion 600.

In the following description, an organic light-emitting display is described as an embodiment of the display apparatus 1. However, the display apparatus 1 according to the invention is not limited thereto. In other words, the display apparatus 1 according to the invention may include an inorganic light-emitting display or a quantum-dot light-emitting display. In an embodiment, an emission layer of a display element included in the display apparatus 1 may include an organic material or an inorganic material, for example. The display apparatus 1 may include quantum dots, an organic material and quantum dots, or an inorganic material and quantum dots.

Figure 3:
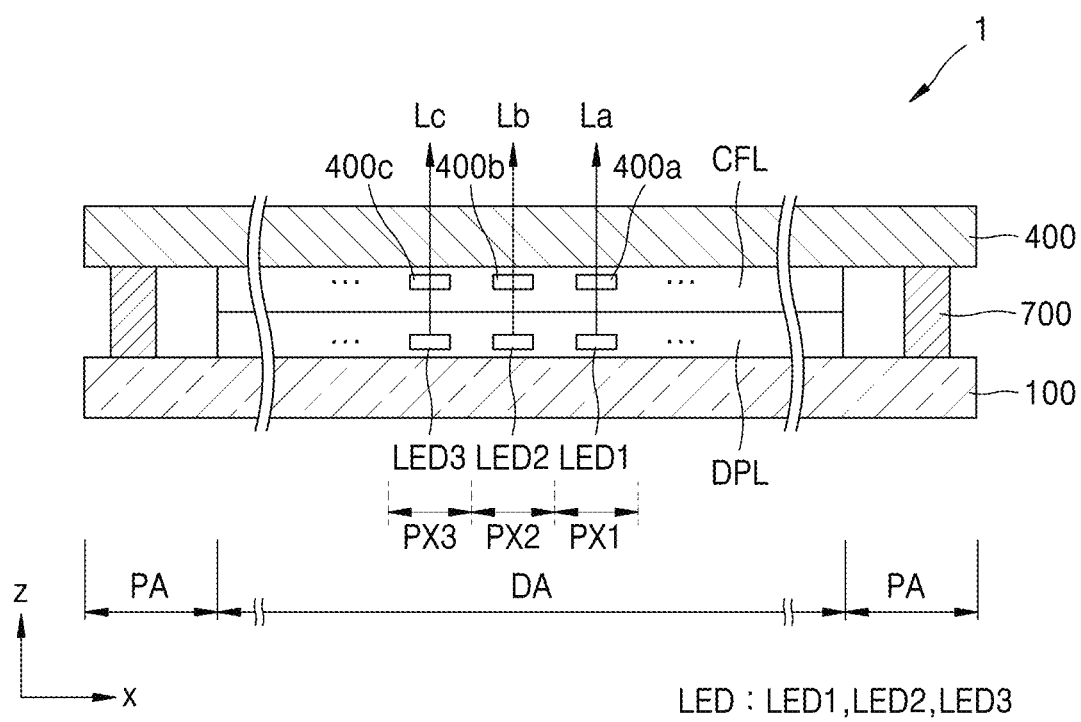
FIG. 3 is a schematic side view of an embodiment of a portion of a display apparatus.

FIG. 3 is a schematic side view of an embodiment of a portion of the display apparatus 1.

Referring to FIG. 3, the display apparatus 1 in an embodiment may include the first substrate 100 and the second substrate 400 arranged above the first substrate 100, such that a lower surface thereof is directed to the first substrate 100. Furthermore, a display layer DPL and a filter layer CFL may be disposed between the first substrate 100 and the second substrate 400.

The display layer DPL may include a plurality of pixels. In an embodiment, the display layer DPL may include a first pixel PX1, a second pixel PX2, and a third pixel PX3. The first pixel PX1, the second pixel PX2, and the third pixel PX3 each may be pixels that emit different colors on the first substrate 100, for example. In an embodiment, the first pixel PX1 may emit first color light La, the second pixel PX2 may emit second color light Lb, and the third pixel PX3 may emit third color light Lc. In an embodiment, the first color light La may be blue light, the second color light Lb may be green light, and the third color light Lc may be red light, for example.

Each pixel may include a light-emitting diode LED. In detail, the first pixel PX1 may include a first light-emitting diode LED1, the second pixel PX2 may include a second light-emitting diode LED2, and the third pixel PX3 may include a third light-emitting diode LED3. The first pixel PX1 may include the first light-emitting diode LED1, the second light-emitting diode LED2, and the third light-emitting diode LED3. In an embodiment, the first to third light-emitting diodes LED1, LED2, and LED3 may emit the first color light La, for example, blue light. In another embodiment, the first to third light-emitting diodes LED1, LED2, and LED3 may emit the first color light La, the second color light Lb, and the third color light Lc, respectively. In another embodiment, the first to third light-emitting diodes LED1, LED2, and LED3 may emit mixed light of the first color light La and the second color light Lb, for example, light in which blue light and green light are mixed.

The filter layer CFL may include first to third color filter portions 400a, 400b, and 400c. Light emitted from the first to third light-emitting diodes LED1, LED2, and LED3 may respectively transmit through the first to third color filter portions 400a, 400b, and 400c, and thus the first to third light-emitting diodes LED1, LED2, and LED3 may emit the first color light La, the second color light Lb, and the third color light Lc, respectively.

Figure 4:
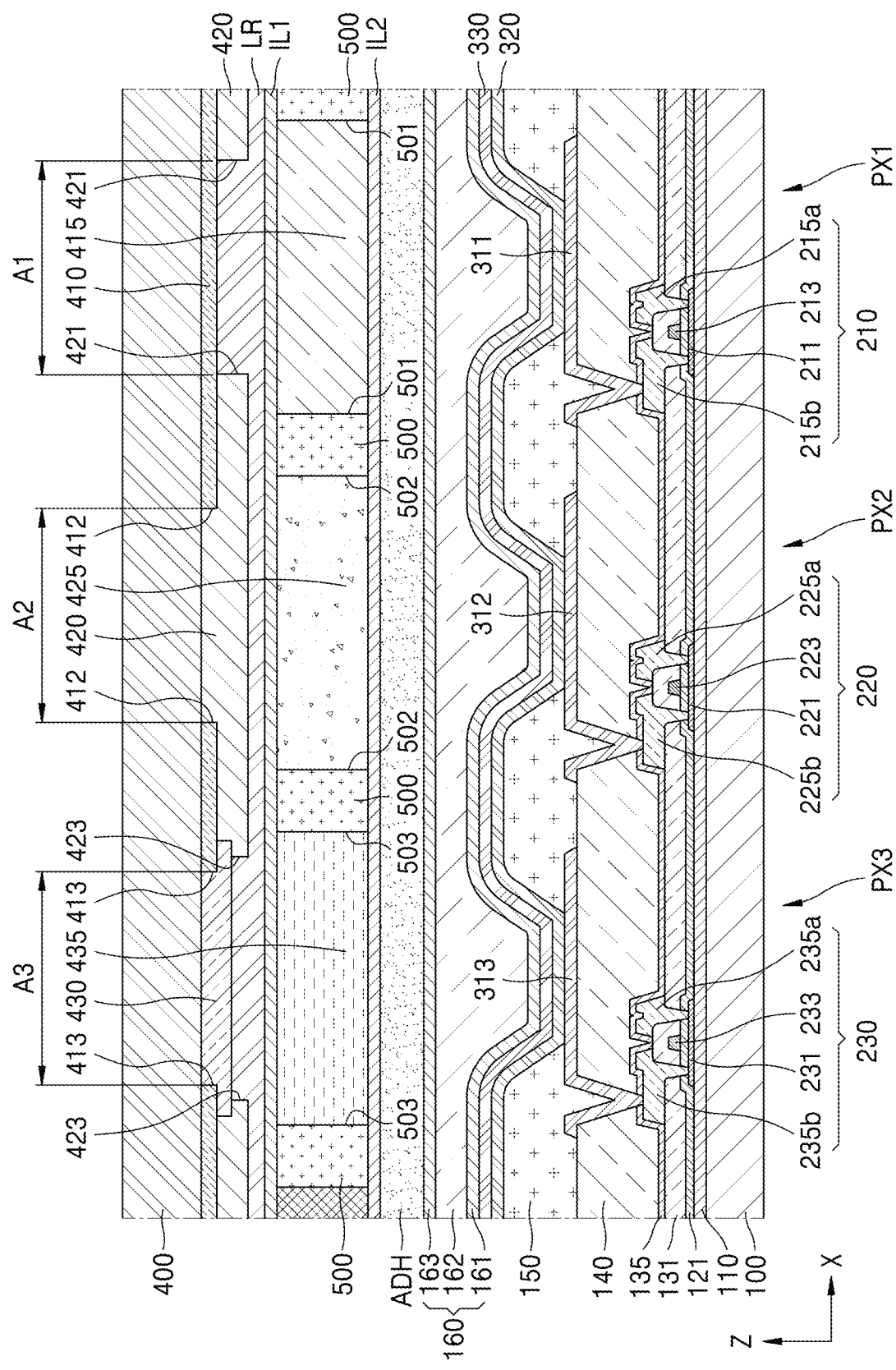
FIG. 4 is a schematic cross-sectional view of an embodiment of a portion of a display apparatus.
Figure 5:
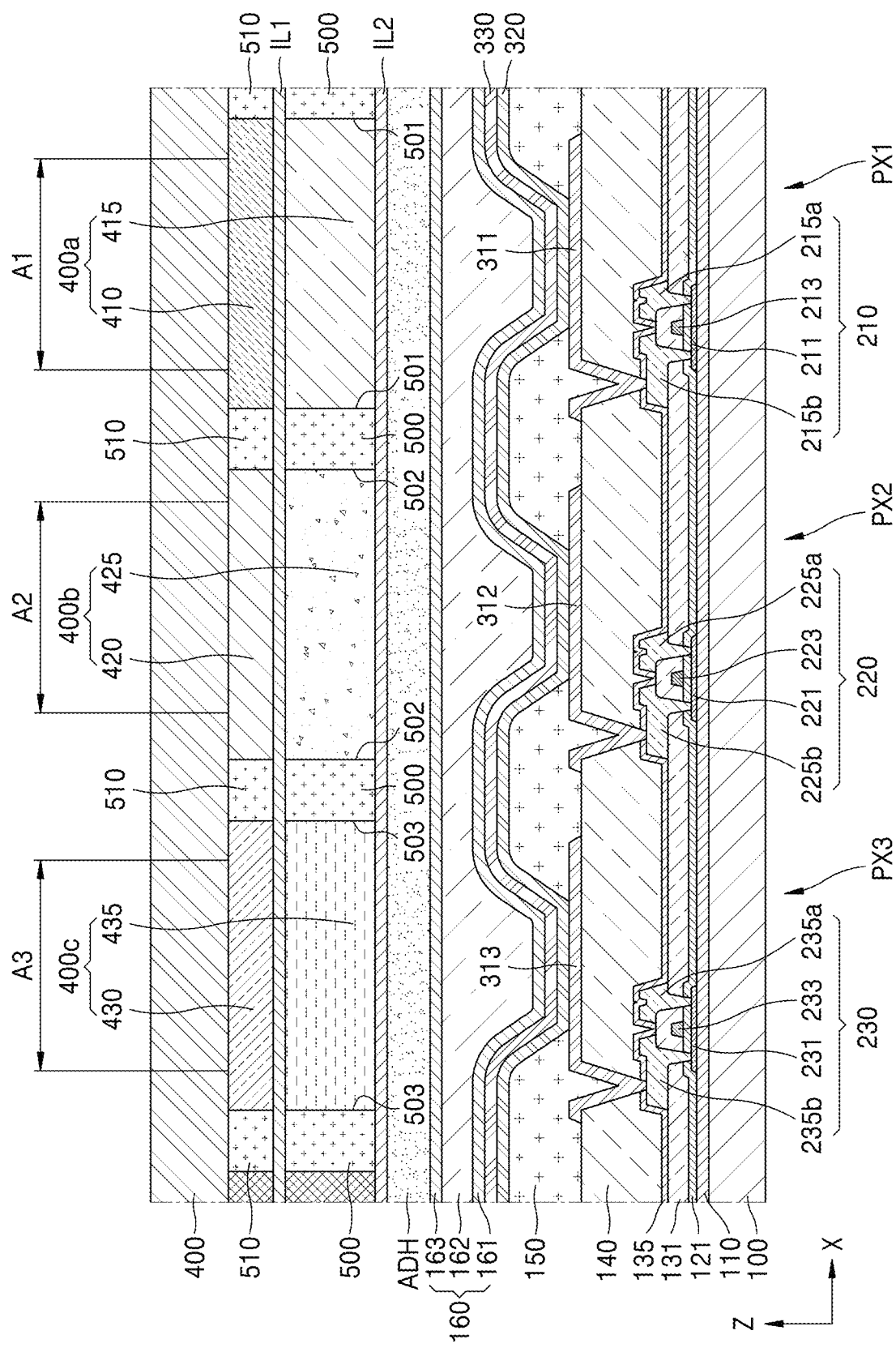
FIG. 5 is a schematic cross-sectional view of another embodiment of a portion of a display apparatus.

FIG. 4 is a schematic cross-sectional view of an embodiment of a portion of a display apparatus, and FIG. 5 is a schematic cross-sectional view of another embodiment of a portion of a display apparatus.

A display apparatus in an embodiment may include the first substrate 100, light-emitting elements arranged on the first substrate 100, the second substrate 400, and filter portions arranged on a lower surface of the second substrate 400 in a direction toward the first substrate 100.

The first substrate 100 may include glass, metal, or polymer resin. In an embodiment, when the first substrate 100 is flexible or bendable, the first substrate 100 may include polymer resin, for example, polyethersulfone, polyacrylate, polyetherimide, polyethylene naphthalate, polyethylene terephthalate, polyphenylene sulfide, polyarylate, polyimide, polycarbonate, or cellulose acetate propionate. The first substrate 100 may have various modifications, for example, a multilayer structure of two layers, and a barrier layer provided between the layers, the two layers each including polymer resin as above, and the barrier layer including an inorganic material such as a silicon oxide, a silicon nitride, a silicon oxynitride, and the like.

A first light-emitting element including a first pixel electrode 311 may be disposed on the first substrate 100. Furthermore, in addition to the first light-emitting element, a first thin film transistor ("TFT") 210 electrically connected to the first light-emitting element may be disposed on the first substrate 100. As illustrated in FIG. 4, the first light-emitting element being electrically connected to the first TFT 210 may mean that the first pixel electrode 311 of the first light-emitting element is electrically connected to the first TFT 210.

The first TFT 210 may include a first semiconductor layer 211, a first gate electrode 213, a first source electrode 215a, and a first drain electrode 215b, the first semiconductor layer 211 including amorphous silicon, polycrystalline silicon, an organic semiconductor material, or an oxide semiconductor material. The first gate electrode 213 may include various conductive materials and have various layered structures, for example, a Mo layer and an Al layer. In this case, the first gate electrode 213 may have a layered structure of Mo/Al/Mo. In an alternative embodiment, the first gate electrode 213 may include a TiNx layer, an Al layer, and/or a Ti layer. The first source electrode 215a and the first drain electrode 215b may also include various conductive materials and have various layered structures, for example a Ti layer, an Al layer, and/or a Cu layer. In this case, the first source electrode 215a and the first drain electrode 215b may have a layered structure of Ti/Al/Ti.

To secure insulation between the first semiconductor layer 211 and the first gate electrode 213, a gate insulating layer 121 may be provided between the first semiconductor layer 211 and the first gate electrode 213. In addition, a first interlayer insulating layer 131 may be disposed on the first gate electrode 213, and the first source electrode 215a and the first drain electrode 215b may be disposed on the first interlayer insulating layer 131. Furthermore, a second interlayer insulating layer 135 may be disposed on the first source electrode 215a and the first drain electrode 215b. The insulating layers may include an inorganic material such as a silicon oxide, a silicon nitride, a silicon oxynitride, and/or the like. In an embodiment, the insulating layers may be provided through chemical vapor deposition ("CVD") or atomic layer deposition ("ALD"). The same applies to the below-described embodiments and modified examples thereof.

A buffer layer 110 including an inorganic material such as a silicon oxide, a silicon nitride, a silicon oxynitride, and/or the like may be provided between the first TFT 210 of the above structure and the first substrate 100. The buffer layer 110 may increase flatness of an upper surface of the first substrate 100 or prevent or reduce infiltration of impurities from the first substrate 100, and the like toward the first semiconductor layer 211 of the first TFT 210.

A planarization layer 140 may be arranged on the first TFT 210. In an embodiment, as illustrated in FIG. 4, when an organic light-emitting diode is arranged as the first light-emitting element on the first TFT 210, the planarization layer 140 may generally planarize an upper portion of a protection film that covers the first TFT 210, for example. In an embodiment, the planarization layer 140 may include an organic material, for example, acryl, benzocyclobutene ("BCB"), hexamethyldisiloxane ("HMDSO"), and the like. Although FIG. 4 illustrates the planarization layer 140 as a single layer, the planarization layer 140 may be modified in various ways, for example, a multilayer and the like.

The first light-emitting element may be disposed on the planarization layer 140 of the first substrate 100. In FIG. 4, an organic light-emitting diode as the first light-emitting element is disposed on the planarization layer 140. The first light-emitting element disposed at the first pixel PX1 may be an organic light-emitting diode that includes the first pixel electrode 311, a counter electrode 330, and an intermediate layer 320 arranged therebetween and including a first color emission layer. The first pixel electrode 311 may be electrically connected to the first TFT 210, as illustrated in FIG. 4, by contacting any one of the first source electrode 215a and the first drain electrode 215b through an opening defined in the second interlayer insulating layer 135, the planarization layer 140, and the like. The first pixel electrode 311 may include a light-transmitting conductive layer including a light-transmitting conductive oxide such as indium tin oxide ("ITO"), $In_2O_3$, indium zinc oxide ("IZO"), and the like and a reflective layer including metal such as Al, Ag, and the like. In an embodiment, the first pixel electrode 311 may have a triple layer structure of ITO/Ag/ITO, for example.

Although the intermediate layer 320 including the first color emission layer may have a shape patterned to correspond to the first pixel electrode 311, as illustrated in FIG. 4, the intermediate layer 320 may be also disposed on a second pixel electrode 312 and a third pixel electrode 313, which are arranged on the first substrate 100, to be unitary across the first pixel electrode 311 to the third pixel electrode 313. The counter electrode 330 on the intermediate layer 320 may be also unitary across the first pixel electrode 311 to the third pixel electrode 313. In an embodiment, the counter electrode 330 may include a light-transmitting conductive layer including ITO, $In_2O_3$, or IZO, and may include a translucent film including metal such as Al, Ag, and the like. In an embodiment, the counter electrode 330 may include a translucent film including Mg or Ag, for example.

A pixel definition layer 150 may be arranged above the planarization layer 140. The pixel definition layer 150, in which openings corresponding to each pixel, e.g., an opening that exposes a center portion of the first pixel electrode 311, are defined, may define a pixel. Furthermore, the pixel definition layer 150 may prevent generation of arcs and the like in an edge of the first pixel electrode 311, by increasing a distance between the edge of the first pixel electrode 311 and the counter electrode 330. In an embodiment, the pixel definition layer 150 may include an organic material, for example, polyimide or HMDSO, and the like.

The intermediate layer 320 may include a low molecular weight or polymer material. When the intermediate layer 320 includes a low molecular weight material, the intermediate layer 320 may have a structure in which a hole injection layer ("HIL"), a hole transport layer ("HTL"), an emission layer ("EML"), an electron transport layer ("ETL"), an electron injection layer ("EIL"), and the like are stacked in a single or composite structure, and may be provided by a vacuum deposition method. When the intermediate layer 320 includes a polymer material, the intermediate layer 320 may have a structure including an HTL and an EML. At this time, the HIL may include poly(3,4-ethylenedioxythiophene) ("PEDOT"), and the EML may include a poly-phenylene vinylene ("PPV")-based polymer material, a polyfluorene-based polymer material, and the like. In an embodiment, the intermediate layer 320 may be provided by a screen print method, an inkjet print method, a deposition method, a laser induced thermal imaging ("LITI") method, and the like. The intermediate layer 320 is not limited thereto, and may have various structures.

Although the intermediate layer 320 may include a layer that is unitary across the first to third pixel electrodes 311, 312, and 313 as described above, as necessary, the intermediate layer 320 may include a layer patterned to correspond to each of the first to third pixel electrodes 311, 312, and 313. In any case, the intermediate layer 320 may include the first color emission layer. The first color emission layer may be unitary across the first to third pixel electrodes 311, 312, and 313, or may be patterned to correspond to each of the first to third pixel electrodes 311, 312, and 313, as necessary. The first color emission layer may emit light in a first wavelength band. In an embodiment, the first color emission layer may emit light of a wavelength of about 450 nanometers (nm) to about 495 nm, for example.

As the above-described organic light-emitting diode may be easily damaged by external moisture or oxygen, and the like, the organic light-emitting diode may be covered and protected by an encapsulation layer 160. The encapsulation layer 160 may include at least one organic encapsulation layer and at least one inorganic encapsulation layer. In an embodiment, the encapsulation layer 160 may include a first inorganic encapsulation layer 161, an organic encapsulation layer 162, and a second inorganic encapsulation layer 163, for example.

The first inorganic encapsulation layer 161 may cover the counter electrode 330, and may include a silicon oxide, a silicon nitride, a silicon trioxynitride, and/or the like. Other layers (not shown) such as a capping layer and the like may be provided between the first inorganic encapsulation layer 161 and the counter electrode 330. As the first inorganic encapsulation layer 161 that is provided along a structure thereunder has an uneven upper surface, the organic encapsulation layer 162 covers the first inorganic encapsulation layer 161, thereby planarizing the upper surface thereof. In an embodiment, the organic encapsulation layer 162 may include one or more materials of polyethylene terephthalate, polyethylene naphthalate, polycarbonate, polyimide, polyethylene sulfonate, polyoxymethylene, polyarylate, and hexamethyldisiloxane. The second inorganic encapsulation layer 163 is arranged covering the organic encapsulation layer 162, and may include a silicon oxide, a silicon nitride, a silicon trioxynitride, and the like.

Even when cracks are generated in the encapsulation layer 160 through the above-described multilayer structure, the encapsulation layer 160 may prevent the cracks from being connected between the first inorganic encapsulation layer 161 and the organic encapsulation layer 162 or between the organic encapsulation layer 162 and the second inorganic encapsulation layer 163. Accordingly, a path through which the external moisture or oxygen, or the like infiltrates inside may be prevented or reduced.

As illustrated in FIG. 4, the display apparatus in an embodiment may include a second light-emitting element disposed in the second pixel PX2. The second light-emitting element may be an organic light-emitting diode that includes, as illustrated in FIG. 4, the second pixel electrode 312, the counter electrode 330, and the intermediate layer 320 arranged therebetween and including the first color emission layer. Not only the second light-emitting element, but also a second TFT 220 electrically connected to the second light-emitting element may be disposed on the first substrate 100. As illustrated in FIG. 4, the second light-emitting element being electrically connected to the second TFT 220 may mean that the second pixel electrode 312 of the second light-emitting element is electrically connected to the second TFT 220. The descriptions of the second pixel electrode 312 and the second TFT 220 are replaced with those of the first pixel electrode 311 and the first TFT 210 described above. In an embodiment, the second TFT 220 may include a second semiconductor layer 221, a second gate electrode 223, a second source electrode 225*a* and a second drain electrode 225*b*.

Furthermore, as illustrated in FIG. 4, the display apparatus in an embodiment may have a third light-emitting element disposed at the third pixel PX3. The third light-emitting element may be an organic light-emitting diode that includes, as illustrated in FIG. 4, the third pixel electrode 313, the counter electrode 330, and the intermediate layer 320 arranged therebetween and including the first color emission layer. Not only the third light-emitting element, but also a third TFT 230 electrically connected to third light-emitting element may be disposed on the first substrate 100. As illustrated in FIG. 4, the third light-emitting element being electrically connected to the third TFT 230 may be that the third pixel electrode 313 of the third light-emitting element is electrically connected to the third TFT 230. The descriptions of the third pixel electrode 313 and the third TFT 230 are replaced with those of the first pixel electrode 311 and the first TFT 210 described above. In an embodiment, the third TFT 230 may include a third semiconductor layer 231, a third gate electrode 233, a third source electrode 235*a* and a third drain electrode 235*b*.

The second substrate 400 may be arranged above the first substrate 100 such that a lower surface of the second substrate 400 faces the first substrate 100. The second substrate 400 may be arranged such that the first to third pixel electrodes 311, 312, and 313 are arranged between the second substrate 400 and the first substrate 100. The second substrate 400 may include polymer resin. In an embodiment, the second substrate 400 may include polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate, for example.

The second substrate 400 may have various modifications, for example, a multilayer structure of two layers, each including polymer resin as above, and a barrier layer including an inorganic material such as a silicon oxide, a silicon nitride, a silicon oxynitride, and the like, and provided between the layers. The second substrate 400 may be flexible or bendable.

The second substrate 400 may include a first area A1 corresponding to the first light-emitting element, a second area A2 corresponding to the second light-emitting element, and a third area A3 corresponding to the third light-emitting element. The expression "corresponding to" may mean that two objects overlap with each other, in a direction (+z-axis direction or −z-axis direction) perpendicular to an upper surface of the second substrate 400. In detail, in the direction (z-axis direction) perpendicular to the upper surface of the second substrate 400, the first area A1 may overlap the first pixel electrode 311, the second area A2 may overlap the second pixel electrode 312, and the third area A3 may overlap the third pixel electrode 313.

Filter portions may be arranged on a lower surface of the second substrate 400 in a direction (−z-axis direction) toward the first substrate 100. The filter portions may include the first to third color filter portions 400*a*, 400*b*, and 400*c* corresponding to the first to third pixels PX1, PX2, and PX3. The first to third color filter portions 400*a*, 400*b*, and 400*c* may overlap the first to third pixel electrodes 311, 312, and 313, respectively, in the direction (z-axis direction) perpendicular to the first substrate 100 or the second substrate 400. The first to third color filter portions 400*a*, 400*b*, and 400*c* may respectively perform filtering on the light emitted from the first to third light-emitting elements. Accordingly, the display apparatus may display a full color image.

In an embodiment, the first color filter portion 400*a* may include a light-transmitting layer 415 arranged in the first area A1 between the second substrate 400 and the counter electrode 330 and a first color filter layer 410 arranged between the second substrate 400 and the light-transmitting layer 415. Furthermore, the second color filter portion 400*b* may include a second color quantum-dot layer 425 arranged in the second area A2 between the second substrate 400 and the counter electrode 330 and a second color filter layer 420 arranged between the second substrate 400 and the second color quantum-dot layer 425. Furthermore, the third color filter portion 400*c* may include a third color quantum-dot layer 435 arranged in the third area A3 between the second substrate 400 and the counter electrode 330 and a third color filter layer 430 arranged between the second substrate 400 and the third color quantum-dot layer 435.

In an embodiment, the first color filter layer 410 may be a layer that transmits only light of a wavelength of about 450 nm to about 495 nm, for example. The first color filter layer 410 may be disposed on the lower surface of the second substrate 400 in the direction (−z-axis direction) toward the first substrate 100. The first color filter layer 410 may cover the first area A1 corresponding to the first light-emitting element of the second substrate 400. As illustrated in FIG. 4, a first-2 opening 412 that exposes the second area A2 corresponding to the second pixel electrode 312 is defined in the first color filter layer 410. The first-2 opening 412 may define an area of the second pixel PX2. Furthermore, a first-3 opening 413 that exposes the third area A3 corresponding to the third pixel electrode 313 is defined in the first color filter layer 410. The first-3 opening 413 may define an area of the third pixel PX3.

In an embodiment, the second color filter layer 420 may be a layer that transmits only light of a wavelength of about 495 nm to about 570 nm, for example. The second color filter layer 420 may include a portion disposed on a lower surface of the first color filter layer 410 in the direction (−z-axis direction) toward the first substrate 100, and a portion filling the first-2 opening 412 of the first color filter layer 410. In the second color filter layer 420, the portion disposed on the lower surface of the first color filter layer 410 in the direction (−z-axis direction) toward the first substrate 100 may serve as a barrier that blocks light. In the second color filter layer 420, the portion filling the first-2 opening 412 of the first color filter layer 410 may be disposed on the lower surface of the second substrate 400 in the direction (−z-axis direction) toward the first substrate 100. As illustrated in FIG. 4, a second-1 opening 421 that exposes the first area A1 corresponding to the first pixel electrode 311 is defined in the second color filter layer 420. The second-1 opening 421 may define an area of the first pixel PX1. Furthermore, a second-3 opening 423 that exposes the third area A3 corresponding to the third pixel electrode 313 may be defined in the second color filter layer 420.

In an embodiment, the third color filter layer 430 may be a layer that transmits only light of a wavelength of about 630 nm to about 780 nm, for example. The third color filter layer 430 fills the first-3 opening 413 of the first color filter layer 410. The third color filter layer 430 may be understood as one filling the second-3 opening 423 of the second color filter layer 420.

The first to third color filter layers 410, 420, and 430 may reduce reflection of external light in the display apparatus. In an embodiment, when the external light arrives at the first color filter layer 410, only light of a preset wavelength as described above may pass through the first color filter layer 410, and light of the other wavelengths may be absorbed by the first color filter layer 410, for example. Accordingly, only light of a preset wavelength as described above among the external light incident on the display apparatus passes through the first color filter layer 410, and part of the light is reflected from the counter electrode 330 or the first pixel electrode 311 thereunder and emitted to the outside. As a result, as only part of the external light incident on a place where the first pixel PX1 is disposed is reflected to the outside, reflection of the external light may be reduced. The above description may be identical to those of the second color filter layer 420 and the third color filter layer 430.

Although FIG. 4 illustrates a case in which the second-1 opening 421 of the second color filter layer 420 defines the first area A1, the first-2 opening 412 of the first color filter layer 410 defines the second area A2, and the first-3 opening 413 of the first color filter layer 410 defines the third area A3, the invention is not limited thereto.

In another embodiment, as illustrated in FIG. 5, a black matrix 510 may be arranged between the first to third color filter layers 410, 420, and 430. As an opening corresponding to each of the first to third areas A1, A2, and A3 is defined in the black matrix 510, areas of the first to third pixels PX1, PX2, and PX3 may be defined. The black matrix 510 may include the same material as a material included in a bank 500 that is described below. In an embodiment, the black matrix 510 may include an inorganic material such as a silicon oxide, a silicon nitride, a silicon oxynitride, and/or the like, for example. In an optional embodiment, the black matrix 510 may include a photoresist material. In this case, the black matrix 510 may be easily provided through a process of exposure and development, and the like.

The bank 500 may be disposed on a lower surface of a first protection layer IL1 that is an insulating layer covering a lower surface of the color filter layers in a direction toward the first substrate 100. The bank 500 may be disposed between a portion where the color filter layers overlap with each other and the first substrate 100. In an embodiment, as illustrated in FIG. 4, the bank 500 may be disposed between a portion where the first color filter layer 410 and the second color filter layer 420 overlap with each other and the first substrate 100. In an optional embodiment, when the display apparatus includes the black matrix 510 as described above, the bank 500 may be overlap with the black matrix 510.

The bank 500 may define the first to third areas A1, A2, and A3. A first opening 501 corresponding to the first area A1, a second opening 502 corresponding to the second area A2, and a third opening 503 corresponding to the third area A3 may be defined in the bank 500. The first to third openings 501, 502, and 503 of the bank 500 may respectively correspond to the openings of the pixel definition layer 150 that respectively define the areas of the first to third pixels PX1, PX2, and PX3. The first to third openings 501, 502, and 503 of the bank 500 respectively corresponding to the openings of the pixel definition layer 150 that respectively define the first to third pixels PX1, PX2, and PX3 may mean that, in the direction (z-axis direction) perpendicular to an upper surface of the second substrate 400, the shape of an edge of each of the first to third openings 501, 502, and 503 of the bank 500 is the same as or similar to the shape of an edge of each of the openings of the pixel definition layer 150 that respectively define the first to third pixels PX1, PX2, and PX3.

The bank 500 may include an inorganic material such as a silicon oxide, a silicon nitride, a silicon oxynitride, and/or the like. In an optional embodiment, the bank 500 may include a photoresist material. In this case, the bank 500 may be easily provided through the process of exposure and development, and the like.

The light-transmitting layer 415 may fill the first opening 501 of the bank 500. In an embodiment, the first color emission layer included in the intermediate layer 320 above the first pixel electrode 311 may emit light in a first wavelength band, for example, light of a wavelength of about 450 nm to about 495 nm. In the first pixel PX1, the light in the first wavelength band is emitted to the outside through the second substrate 400 without changing the wavelength. Accordingly, the first pixel PX1 does not have a quantum dot layer. As no quantum dot layer is necessary in the first opening 501 of the bank 500, the light-transmitting layer 415 including light-transmitting resin may be arranged. In an embodiment, the light-transmitting layer 415 may include acryl, BCB, or HMDSO, for example. In an optional embodiment, unlike the illustration in FIG. 4, the light-transmitting layer 415 may not be in the first opening 501 of the bank 500.

The second color quantum-dot layer 425 fills the second opening 502 of the bank 500. The second color quantum-dot layer 425 may convert the light in the first wavelength band generated in the intermediate layer 320 on the second pixel electrode 312 to light in a second wavelength band. In an embodiment, when the light of a wavelength of about 450 nm to about 495 nm is generated in the intermediate layer 320 on the second pixel electrode 312, the second color quantum-dot layer 425 may convert the generated light to the light of a wavelength of about 495 nm to about 570 nm, for example. Accordingly, in the second pixel PX2, the light of a wavelength of about 495 nm to about 570 nm may be emitted to the outside through the second substrate 400.

The third color quantum-dot layer 435 may fill the third opening 503 of the bank 500. The third color quantum-dot layer 435 may convert the light in the first wavelength band generated in the intermediate layer 320 on the third pixel electrode 313 to light in a third wavelength band. In an embodiment, when the light of a wavelength of about 450 nm to about 495 nm is generated in the intermediate layer 320 on the third pixel electrode 313, the third color quantum-dot layer 435 may convert the generated light to the light of a wavelength of about 630 nm to about 780 nm, for example. Accordingly, in the third pixel PX3, the light of a wavelength of about 630 nm to about 780 nm may be emitted to the outside through the second substrate 400.

The second color quantum-dot layer 425 and the third color quantum-dot layer 435 each may be in the form of quantum dots being distributed in resin. In an embodiment, a quantum dot may include a semiconductor material such as cadmium sulfide (CdS), cadmium telluride (CdTe), zinc sulfide (ZnS), indium phosphide (InP), and the like. A quantum dot may have a size of several nanometers, and the wavelength of light after conversion may vary according to the size of a quantum dot. Furthermore, any light-transmitting material may be used as resin included in the second color quantum-dot layer 425 and the third color quantum-dot layer 435. In an embodiment, polymer resin such as acryl, BCB, or HMDSO may be used as a material for forming the second color quantum-dot layer 425 and the third color quantum-dot layer 435, for example. The material for forming the second color quantum-dot layer 425 and the third color quantum-dot layer 435 may be arranged in each of the second opening 502 and the third opening 503 of the bank 500 through an inkjet printing method.

The first protection layer IL1 may be arranged between the first color filter layer 410 and the light-transmitting layer 415, between the second color filter layer 420 and the second color quantum-dot layer 425, and between the third color filter layer 430 and the third color quantum-dot layer 435. Furthermore, a second protection layer IL2 may cover lower surfaces of the light-transmitting layer 415, the second color quantum-dot layer 425, and the third color quantum-dot layer 435 in a direction toward the first substrate 100. Furthermore, the first protection layer IL1 and the second protection layer IL2 may be unitary with each other on the entire surface of the second substrate 400. The first protection layer IL1 and the second protection layer IL2 may prevent damage to the color filter layers and the quantum dot layers in a manufacturing process or in a process of use after manufacture.

The first protection layer IL1 and the second protection layer IL2 may include a material such as a silicon oxide, a silicon nitride, a silicon oxynitride, and the like as an inorganic insulating material having light transmissivity. Furthermore, the first protection layer IL1 and the second protection layer IL2 may include a layer including one or more materials of polyethylene terephthalate, polyethylene naphthalate, polycarbonate, polyimide, polyethylene sulfonate, polyoxymethylene, polyarylate, and hexamethyldisiloxane. Furthermore, in an optional embodiment, differently from the embodiment illustrated in FIG. 4 in which a low-refractive layer LR is disposed on an upper surface of the first protection layer IL1, a low-refractive layer LR may be disposed on a lower surface of the first protection layer IL1. The low-refractive layer LR may improve the light efficiency of the display apparatus as a layer including a material having a low refractive index. In an embodiment, an adhesive layer ADH may be disposed between the second inorganic encapsulation layer 163 and the second protection layer IL2.

Figure 6:
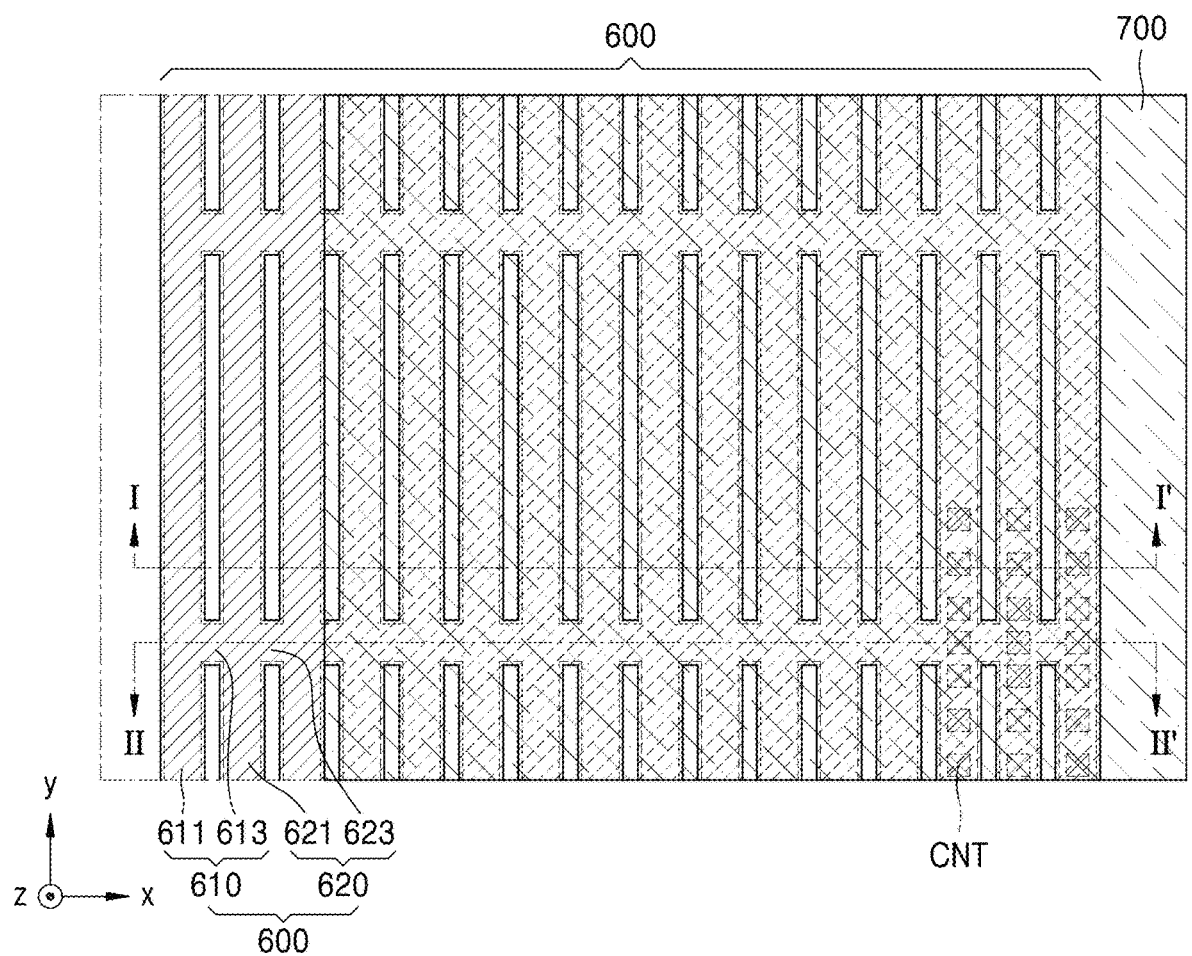
FIG. 6 is a schematic plan view of a portion of an embodiment of a display apparatus.

FIG. 6 is a schematic plan view of an embodiment of a portion of a display apparatus. For reference, in FIG. 6, for convenience, components other than the shield pattern portion 600 and the sealing portion 700 are omitted.

As illustrated in FIG. 6, the shield pattern portion 600 included in the display apparatus in an embodiment may include a lower pattern layer 610 and an upper pattern layer 620, which surround at least part of the display area DA. Furthermore, although not illustrated in FIG. 6, an insulating layer may be provided between the lower pattern layer 610 and the upper pattern layer 620, and an upper surface of the upper pattern layer 620 may be covered with an insulating layer.

Contact holes CNT may be defined in one side of the insulating layer provided between the lower pattern layer 610 and the upper pattern layer 620. The upper pattern layer 620 may be electrically connected to the lower pattern layer 610 through the contact holes CNT. As such, the shield pattern portion 600, which has two pattern layers that overlap with each other and are electrically connected to each other, may effectively absorb static electricity.

The lower pattern layer 610 and the upper pattern layer 620 may overlap each other and each may have a patterned structure. In an embodiment, the lower pattern layer 610 and the upper pattern layer 620 each may have a mesh structure. In detail, the lower pattern layer 610 may include first wirings 611 extending in a first direction (y-axis direction), and a first bridge electrode 613 extending in a second direction (x-axis direction) intersecting with the first direction. The first wirings 611 may be arranged not to intersect with each other and may extend by surrounding at least one side of the display area DA. The first bridge electrode 613 may be arranged in a direction intersecting with the direction in which the first wirings 611 are arranged, and may be connected to the first wirings 611. The first bridge electrode 613 may electrically connect the first wirings 611. Furthermore, the first bridge electrode 613 may be unitary with the first wirings 611.

In an embodiment, as illustrated in FIG. 6, the first wirings 611 may be parallel with each other by extending in the first direction, for example. The first bridge electrode 613 may extend in the second direction intersecting with the first direction, and may be unitary with the first wirings 611, thereby electrically connecting the first wirings 611. Furthermore, the first bridge electrodes 613 may be spaced apart from each other at a preset interval. Although FIG. 6 illustrates an embodiment of two first bridge electrodes as the first bridge electrode 613, the number, arrangement interval, and the like of the first bridge electrodes 613 may be limitless.

As illustrated in FIG. 6, the upper pattern layer 620 may include second wirings 621 overlapping the first wirings 611 of the lower pattern layer 610, and a second bridge electrode 623 overlapping the first bridge electrode 613 of the lower pattern layer 610. In other words, the upper pattern layer 620 may include the second wirings 621 extending in the first direction, and the second bridge electrode 623 extending in the direction intersecting with the first direction. The second wirings 621 may be arranged not to intersect each other and may extend by surrounding at least one side of the display area DA. The second bridge electrode 623 may be arranged in a direction intersecting with the direction in which the second wirings 621 are arranged and may be connected to the second wirings 621. The second bridge electrode 623 may electrically connect the second wirings 621. Furthermore, the second bridge electrode 623 may be unitary with the second wirings 621.

The sealing portion 700 may overlap some of the components of the display apparatus, and thus, the dead space of the display apparatus may be reduced. In an embodiment, as illustrated in FIG. 6, the sealing portion 700 may cover one side of the shield pattern portion 600 in a direction toward the display area DA or a direction toward the display layer DPL, for example.

Figure 7:
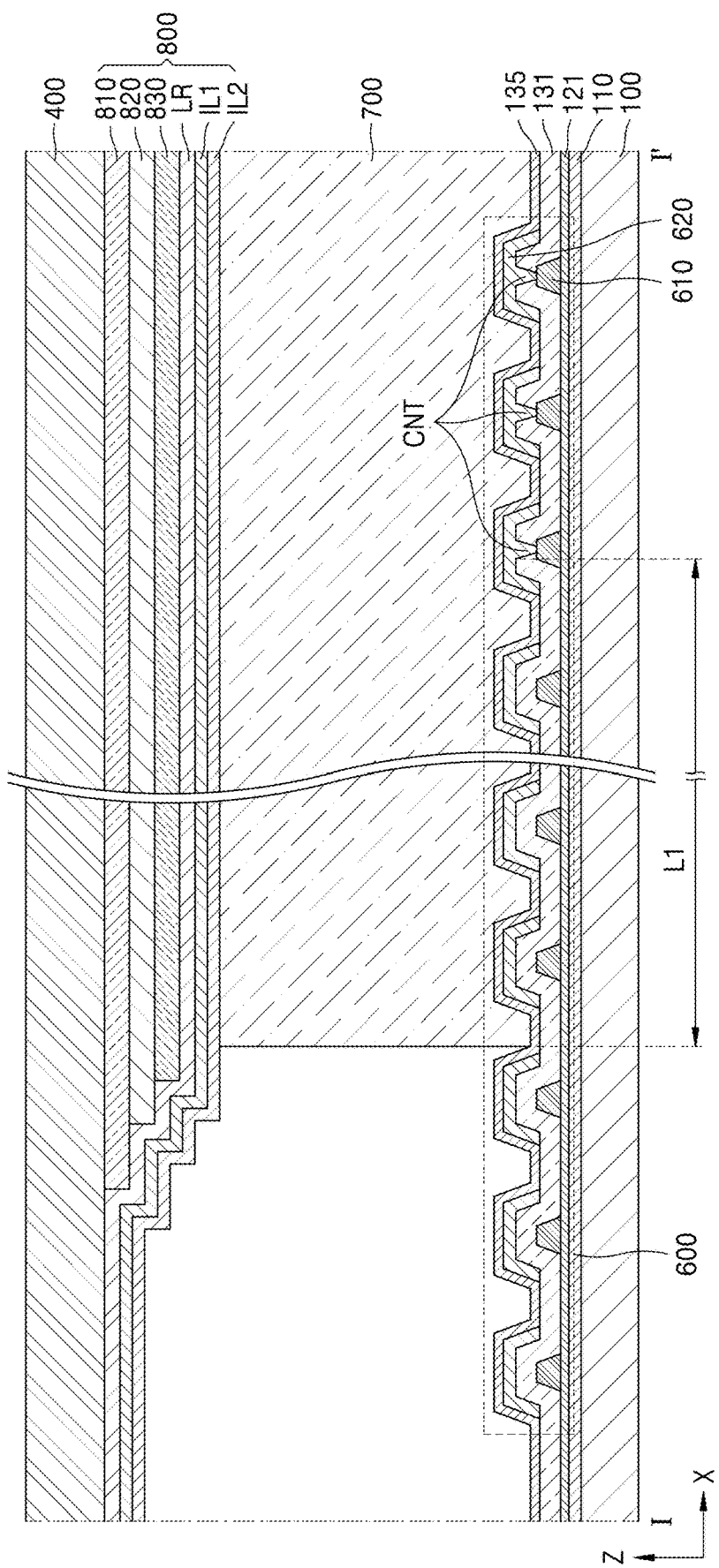
FIG. 7 is a schematic cross-sectional view of an embodiment of a portion of a display apparatus.
Figure 8:
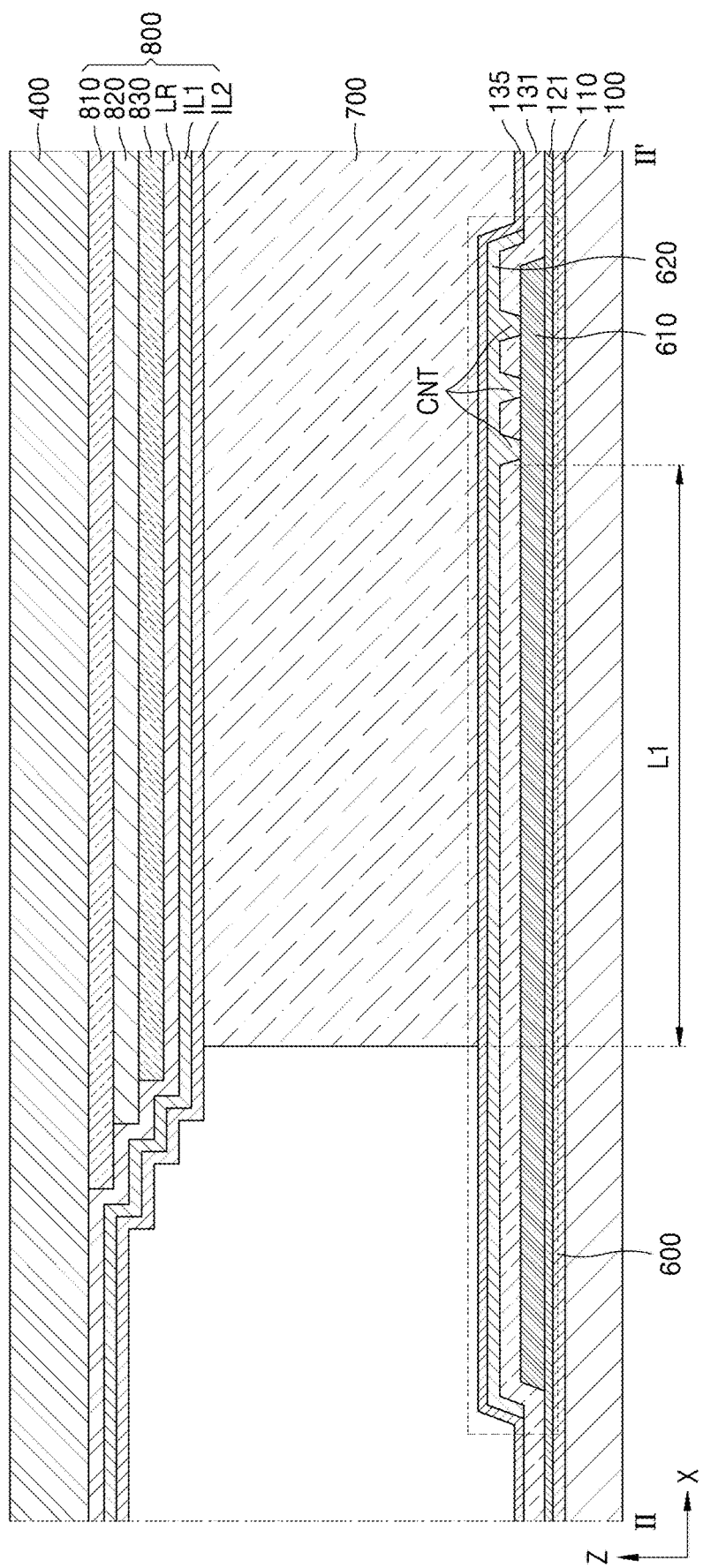
FIG. 8 is a schematic cross-sectional view of an embodiment of a portion of a display apparatus.
Figure 9:
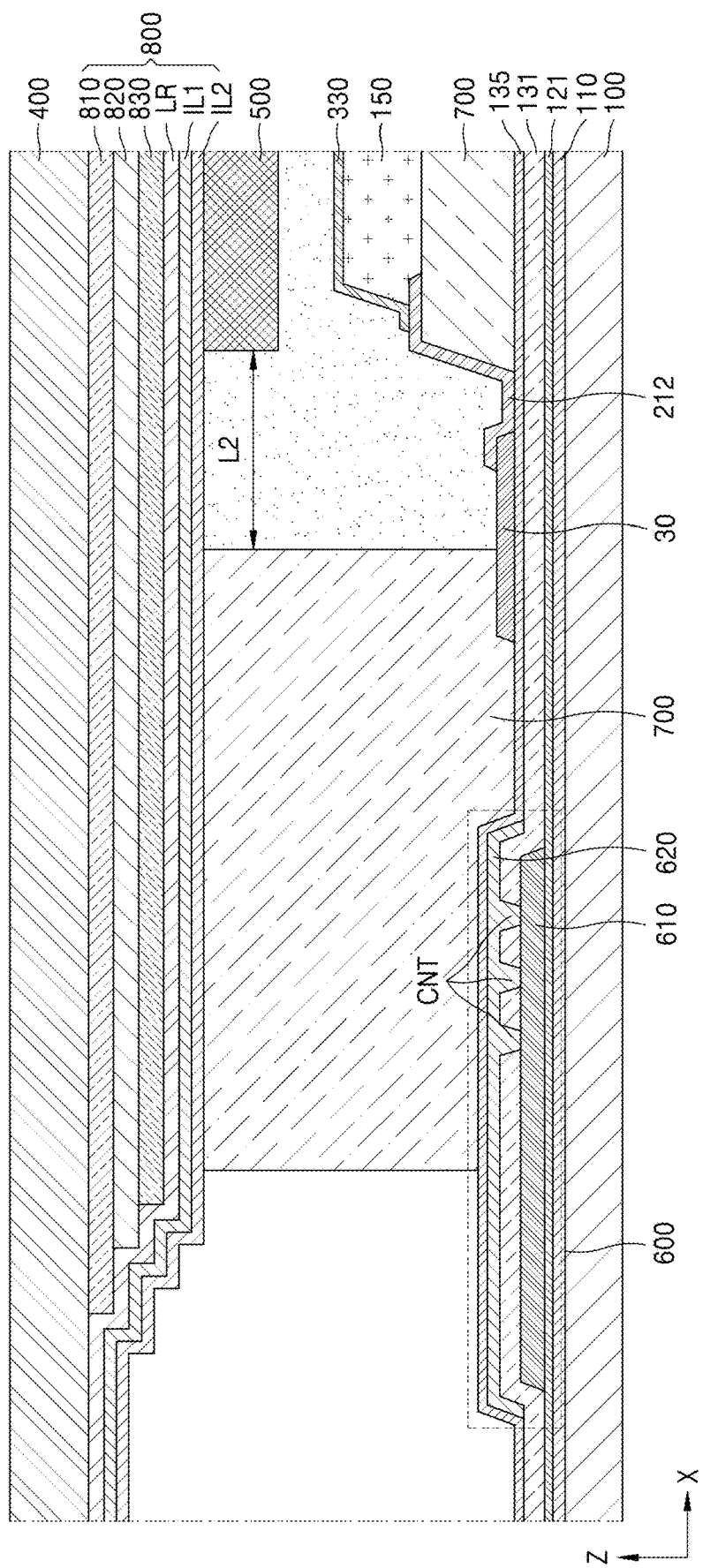
FIG. 9 is a schematic cross-sectional view of an embodiment of a portion of a display apparatus.

FIGS. 7 to 9 are schematic cross-sectional views of an embodiment of a portion of a display apparatus. FIG. 7 is a cross-sectional view of the display apparatus taken along line I-I' of FIG. 6. FIG. 8 is a cross-sectional view of the display apparatus taken along line II-II' of FIG. 6. Throughout the drawings, like reference numerals denote like constituent elements, and thus redundant descriptions thereof are omitted.

In an embodiment, as illustrated in FIGS. 7 to 9, the lower pattern layer 610 may include the same material as the material included in the gate electrode of the above-described TFT, and may have the same layer structure as that of the gate electrode. In other words, the lower pattern layer 610 may be simultaneously provided in the same process of forming the gate electrode of the TFT.

Furthermore, the upper pattern layer 620 may include the same material as the material included in the source electrode and/or the drain electrode of the above-described TFT, and may have the same layer structure as that of the source electrode and/or the drain electrode. In other words, the lower pattern layer 610 may be simultaneously provided in the same process of forming the source electrode and/or the drain electrode of the TFT.

The sealing portion 700 may cover an inner end portion (e.g., right end portion in FIG. 9) of the shield pattern portion 600 and an outer end portion (e.g., left end portion in FIG. 9) of the power supply wiring 30. In an embodiment, the inner end portion of the power supply wiring 30 that is opposite to the outer end portion of the power supply wiring 30 may be covered with a conductive film 212. As the inner end portion of the power supply wiring 30 is covered with the conductive film 212, one side of the conductive film 212 is electrically connected to the power supply wiring 30, and the other side thereof is electrically connected to the counter electrode 330, and thus, the power supply wiring 30 may supply power to the counter electrode 330. The conductive film 212 may include the same material as that of the pixel electrode. In an embodiment, the conductive film 212 may have a stacked structure of ITO/Ag/ITO, for example. In another embodiment, the conductive film 212 may be omitted. In this case, the power supply wiring 30 extending toward the display area DA may be directly connected to the counter electrode 330.

Furthermore, an insulating layer provided between the lower pattern layer 610 and the upper pattern layer 620, and an insulating layer covering the upper surface of the upper pattern layer 620, may be arranged across the entire surface of the first substrate 100. In other words, the insulating layer between the lower pattern layer 610 and the upper pattern layer 620, and the insulating layer covering the upper surface of the upper pattern layer 620, may extend not only to the peripheral area PA where the shield pattern portion 600 is arranged, but also to the display area DA. In an embodiment, the insulating layer between the lower pattern layer 610 and the upper pattern layer 620 may be the first interlayer insulating layer 131 described above, and the insulating layer covering the upper surface of the upper pattern layer 620 may be the second interlayer insulating layer 135 described above.

The shield pattern portion 600 may have defects due to infiltration of moisture, destruction of an insulating layer, diffusion of a metal oxide, and the like in a portion where the contact holes CNT are arranged. In the illustrated embodiments, to prevent the generation of defects, the sealing portion 700 overlaps the contact holes CNT of the shield pattern portion 600. In other words, the contact holes CNT in the insulating layer between the lower pattern layer 610 and the upper pattern layer 620 of the shield pattern portion 600 may be arranged only in an area overlapping the sealing portion 700, not in an area that does not overlap the sealing portion 700. In an embodiment, the contact holes CNT may be arranged in the shield pattern portion 600, only in a portion covered with the sealing portion 700, and may not be arranged in a portion where the shield pattern portion 600 is not covered with the sealing portion 700, for example, an outer area of the sealing portion 700. As such, as the sealing portion 700 covers a portion where the contact holes CNT of the shield pattern portion 600 are arranged, not to be directly exposed to a moisture environment, the reliability of a product may be improved, for example.

In an embodiment, the contact holes CNT of the shield pattern portion 600 may be inwardly spaced apart from an outer edge of the sealing portion 700 by a preset distance. This may be understood such that, considering process spread, all of the contact holes CNT are arranged inner than the outer edge of the sealing portion 700.

In an embodiment, as illustrated in FIGS. 7 and 8, a distance from an edge of a contact hole CNT, which is defined at the outermost side (e.g., leftmost side in FIGS. 7 and 8), among the contact holes CNT on an upper surface of the first interlayer insulating layer 131 to an outer edge of the sealing portion 700 may be greater than or equal to a preset first distance L1. In a detailed example, the distance from an edge of a contact hole CNT, which is disposed at the outermost side, among the contact holes CNT on an upper surface of the first interlayer insulating layer 131 to an outer edge of the sealing portion 700 may be greater than or equal to about 300 micrometers (μm), for example.

The bank 500 may extend from the display area DA in a direction toward the peripheral area PA. In an embodiment, an extended portion of the bank 500 may not overlap the sealing portion 700. The bank 500 may extend from the display area DA in a direction toward the sealing portion 700 and discontinue in an area adjacent to the inner edge of the sealing portion 700. In other words, the bank 500 may be spaced apart from the sealing portion 700 by a predetermined distance.

In an embodiment, as illustrated in FIG. 9, a distance from an outer edge of the bank 500 to an inner edge of the sealing portion 700 may be greater than or equal to a preset second distance L2, for example. This may be understood such that, considering the process spread, the bank 500 is arranged inner than the inner edge of the sealing portion 700. In a detailed example, the distance from the outer edge of the bank 500 to the inner edge of the sealing portion 700 may be greater than or equal to about 300 μm.

As such, when the bank 500 is spaced apart from the sealing portion 700, not to overlap the sealing portion 700, the thickness of the sealing portion 700 may be increased. Furthermore, as a space between the bank 500 and the sealing portion 700 has a step with nearby components, thickness spread of a material, for example, a filler, and the like, filling an inner area of the sealing portion 700 may be caused. To prevent the above issue, the display apparatus in an embodiment may further include a support layer 800.

The support layer 800 may improve the step between the first substrate 100 and the second substrate 400. The support layer 800 may be disposed between the second substrate 400 and the sealing portion 700 such that a lower surface thereof is directed to the first substrate 100. The upper surface of the sealing portion 700 may not be bonded to the lower surface of the second substrate 400, and may be bonded to the lower surface of the support layer 800 in a direction toward the first substrate 100. Accordingly, the thickness of the sealing portion 700 may be reduced by the thickness of the support layer 800.

In an embodiment, the support layer 800 may include a first sub-layer 810 disposed on the lower surface of the second substrate 400, a second sub-layer 820 disposed on a lower surface of the first sub-layer 810, and a third sub-layer 830 disposed on a lower surface of the second sub-layer 820. In this state, the first sub-layer 810 may include the same material as that of the above-described first color filter layer 410 of FIG. 4. Furthermore, the second sub-layer 820 may include the same material as that of the second color filter layer 420 of FIG. 4. Furthermore, the third sub-layer 830 may include the same material as that of the third color filter layer 430 of FIG. 5. Accordingly, the first to third sub-layers 810, 820, and 830 may be simultaneously provided in the process of forming the first to third color filter layers 410, 420, and 430, respectively.

In an embodiment, the support layer 800 may further include the low-refractive layer LR and/or at least one insulating layer disposed on a lower surface of the third sub-layer 830. In detail, the first protection layer IL1, the second protection layer IL2, and/or the low-refractive layer LR, which extend from the display area DA, may be disposed on the lower surface of the third sub-layer 830. In an embodiment, only the first protection layer IL1 and the second protection layer IL2 may be disposed, or the low-refractive layer LR, the first protection layer IL1, and the second protection layer IL2 may be sequentially stacked on the lower surface of the third sub-layer 830, for example. Accordingly, the support layer 800 may be provided relatively thicker, and the thickness of the sealing portion 700 may be further reduced.

Although the display apparatus is mainly described in the above, the invention is not limited thereto. A method of manufacturing the display apparatus may belong to the scope of the invention, for example.

In an embodiment of the invention, a display apparatus with improved reliability may be implemented. The scope of the invention is not limited by the above effects.

It should be understood that embodiments described herein should be considered in a descriptive sense only and not for purposes of limitation. Descriptions of features or advantages within each embodiment should typically be considered as available for other similar features or advantages in other embodiments. While one or more embodiments have been described with reference to the drawing figures, it will be understood by those of ordinary skill in the art that various changes in form and details may be made therein without departing from the spirit and scope of the invention.

What is claimed is:

1. A display apparatus comprising:
   a first substrate comprising a display area and a peripheral area outside the display area;
   a display layer disposed in the display area and comprising first to third light-emitting elements;
   a shield pattern portion comprising a first pattern layer disposed in the peripheral area and surrounding at least part of the display layer, and a second pattern layer disposed on the first pattern layer and electrically connected to the first pattern layer through contact holes in an insulating layer covering the first pattern layer;
   a second substrate disposed on the display layer such that a surface of the second substrate facing the first substrate is directed to the display layer; and
   a sealing portion surrounding at least a part of the display layer, disposed between the first substrate and the second substrate, covering one side of the shield pattern portion in a direction toward the display layer, and overlapping the contact holes.

2. The display apparatus of claim 1, wherein the contact holes are arranged only in an area overlapping the sealing portion.

3. The display apparatus of claim 2, wherein a distance from an edge of a contact hole arranged at an outermost side among the contact holes on a surface of the insulating layer facing the second substrate to an outer edge of the sealing portion is greater than or equal to a preset distance.

4. The display apparatus of claim 3, wherein the distance from the edge of the contact hole arranged at the outermost side among the contact holes on the surface of the insulating layer to the outer edge of the sealing portion is greater than or equal to about 300 micrometers.

5. The display apparatus of claim 1, wherein the first pattern layer comprises first wirings which extend in a first direction and a first bridge electrode which extends in a second direction intersecting with the first direction and electrically connects the first wirings.

6. The display apparatus of claim 5, wherein the second pattern layer comprises second wirings which overlap the first wirings and a second bridge electrode which overlaps the first bridge electrode.

7. The display apparatus of claim 6, wherein the first wirings and the first bridge electrode are unitary with each other, and
   the second wirings and the second bridge electrode are unitary with each other.

8. The display apparatus of claim 1, wherein the display layer further comprises thin film transistors which are electrically connected to each of the first to third light-emitting elements and comprise a semiconductor layer, a gate electrode overlapping the semiconductor layer, and a source electrode and a drain electrode which are both electrically connected to the semiconductor layer.

9. The display apparatus of claim 8, wherein the first pattern layer and the gate electrode comprise a same material and have a same layer structure.

10. The display apparatus of claim 8, wherein the second pattern layer, and the source electrode and the drain electrode, comprise a same material and a same layer structure.

11. The display apparatus of claim 1, further comprising a support layer which is disposed between the second substrate and the sealing portion such that a surface of the support layer is directed to the first substrate.

12. The display apparatus of claim 11, wherein the second substrate comprises a first area corresponding to the first light-emitting element, a second area corresponding to the second light-emitting element, and a third area corresponding to the third light-emitting element, and further comprises:
   a first color filter layer disposed on the surface of the second substrate in the first area;
   a second color filter layer disposed on the surface of the second substrate in the second area; and
   a third color filter layer disposed on the surface of the second substrate in the third area.

13. The display apparatus of claim 12, wherein the support layer comprises a first sub-layer disposed on the surface of the second substrate, a second sub-layer disposed on a surface of the first sub-layer facing the first substrate, and a third sub-layer disposed on a surface of the second sub-layer facing the first substrate.

14. The display apparatus of claim 13, wherein the first sub-layer comprises a same material as a material included in the first color filter layer, the second sub-layer comprises a same material as a material included in the second color filter layer, and the third sub-layer comprises a same material as a material included in the third color filter layer.

15. The display apparatus of claim 13, wherein the support layer further comprises at least one insulating layer which is disposed on a surface of the third sub-layer facing the first substrate.

16. The display apparatus of claim 13, wherein the support layer further comprises a low-refractive layer which is disposed on a surface of the third sub-layer facing the first substrate.

17. The display apparatus of claim 16, wherein the support layer further comprises at least one insulating layer which is disposed on a surface of the low-refractive layer facing the first substrate.

18. The display apparatus of claim 12, further comprising:
a bank disposed on a surface of an insulating layer facing the first substrate, the insulating layer covering surfaces of the first color filter layer to the third color filter layer facing the first substrate, and defining a first opening corresponding to the first area, a second opening corresponding to the second area, and a third opening corresponding to the third area;
a light-transmitting layer filling the first opening;
a second color quantum-dot layer filling the second opening; and
a third color quantum-dot layer filling the third opening.

19. The display apparatus of claim 18, wherein a distance from an outer edge of the bank to an inner edge of the sealing portion is greater than or equal to a preset distance.

20. The display apparatus of claim 19, wherein the distance from the outer edge of the bank to the inner edge of the sealing portion is greater than or equal to about 300 micrometers.

\* \* \* \* \*